United States Patent
Zhang

(10) Patent No.: US 9,703,132 B2
(45) Date of Patent: Jul. 11, 2017

(54) IRON FRAME OF A DISPLAY AND A DISPLAY MODULE

(71) Applicant: Shenzhen China Star Optoelectronics Technology Co., Ltd., Shenzhen, Guangdong (CN)

(72) Inventor: Yanxue Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 242 days.

(21) Appl. No.: 14/426,746

(22) PCT Filed: Jan. 4, 2015

(86) PCT No.: PCT/CN2015/070066
§ 371 (c)(1),
(2) Date: Mar. 7, 2015

(87) PCT Pub. No.: WO2016/082308
PCT Pub. Date: Jun. 2, 2016

(65) Prior Publication Data
US 2016/0343277 A1  Nov. 24, 2016

(30) Foreign Application Priority Data
Nov. 26, 2014 (CN) .......................... 2014 1 0693763

(51) Int. Cl.
*G06F 1/16* (2006.01)
*G02F 1/1333* (2006.01)
*G09F 9/30* (2006.01)
*H05K 7/18* (2006.01)
*H05K 5/02* (2006.01)

(52) U.S. Cl.
CPC .......... *G02F 1/133308* (2013.01); *G09F 9/30* (2013.01); *H05K 5/02* (2013.01); *H05K 7/18* (2013.01)

(58) Field of Classification Search
CPC ................................................ G02F 1/133308
USPC ....................................... 349/58; 361/679.24
See application file for complete search history.

(56) References Cited

U.S. PATENT DOCUMENTS

| 7,944,520 B2 * | 5/2011 | Ichioka | G02F 1/133308 349/58 |
| 2001/0002145 A1 * | 5/2001 | Lee | G02F 1/133308 349/58 |
| 2009/0231507 A1 * | 9/2009 | Oohira | G02F 1/133608 349/58 |

(Continued)

*Primary Examiner* — Nidhi Thaker
(74) *Attorney, Agent, or Firm* — Andrew C. Cheng

(57) ABSTRACT

The present invention discloses that an iron frame of a display comprises an upper surface and a lower surface, the upper surface comprises a first container to dispose a display panel, an optical film and a light guide plate, and the lower surface comprises at least one second container to dispose an electronic component. Meanwhile, the present invention further provides that a display module comprises an iron frame of display, a display panel, and an optical film and a light guide plate, the iron frame of a display comprises an upper surface and a lower surface, the upper surface comprises a first container to dispose a display panel, an optical film and a light guide plate, and the lower surface comprises a second container to dispose an electronic component.

7 Claims, 1 Drawing Sheet

(56) References Cited

U.S. PATENT DOCUMENTS

2011/0051033 A1\* 3/2011 Shimizu ............ G02F 1/133308
 349/58
2011/0128463 A1\* 6/2011 Ji ...................... G02F 1/133308
 349/58

\* cited by examiner

IRON FRAME OF A DISPLAY AND A DISPLAY MODULE

BACKGROUND OF THE INVENTION

1. Field of the Invention

The present invention relates to a display technology field, in particular to an iron frame of a display and a display module.

2. The Related Arts

In a design of mobile communication products and Pad-typed products, display module is designed usually as an independent module. When a whole unit assembles, display module would assemble on a backplane. Except a function of the backplane is mounting a battery, a processor and other models, a further important function is increasing structural strength of a whole product. Due to a majority of modules with backplane simultaneously design a rubber frame and an iron frame, whose main function is also increasing the structural strength. Therefore, a module iron frame, a rubber frame and a backplane of a whole device contribute to overlapping functions, and meanwhile are not favorable in thinning products, narrowing frame designs and reducing cost.

SUMMARY

Because of the insufficiencies of the prior art, the invention provides an iron frame and a display module to decrease the overlapping function in structures and reducing cost.

To achieve the above objects, the present invention adopts technical programs as following:

An iron frame of a display comprises an upper surface and a lower surface, the upper surface comprises a first container to dispose a display panel, an optical film and a light guide plate, and the lower surface comprises at least one second container to dispose an electronic component.

Wherein, two step portions are disposed at two opposite end faces at least of the first container to fix the display panel.

Wherein, the second containers comprise a battery container and a processor container.

A display module provided further by the present invention comprises an iron frame of display, a display panel, an optical film and a light guide plate, the iron frame of a display comprises an upper surface and a lower surface, the upper surface comprises a first container to dispose a display panel, an optical film and a light guide plate, and the lower surface comprises a second container to dispose an electronic component.

Wherein, step portions are disposed at two opposite end faces at least of the first container to fix the display panel.

Wherein, the second containers comprise a battery container and a processor container.

Wherein, further comprises a reflective film disposed at the upper surface, and the reflective film is disposed at a lower surface of the light guide plate Wherein, further comprises a shading tape, and the display panel is adhesive to upper surfaces of the step portions by the shading tape.

Wherein, part of the shading tape is adhesive to an upper surface of the optical film.

The present invention provides an iron frame, both sides of the iron frame of a display dispose containers used respectively to dispose a display panel, an optical film, a light guide plate and electronic components, and save structures of a glue frame and a backplane, and simultaneously provides display module that using the iron frame of a display can prevent functional overlapping of structures, and benefit in thinning of products, designing narrow frames and reducing cost.

DETAILED DESCRIPTION OF THE EMBODIMENTS

To make the objects, technical solutions and advantages of the present invention will be more clearly understood, the accompanying drawings and the following embodiments of the present invention will be described in more detail. It should be understood that the specific embodiment described herein are merely to illustrate the invention and are not intended not limited the present invention.

Figure 1:
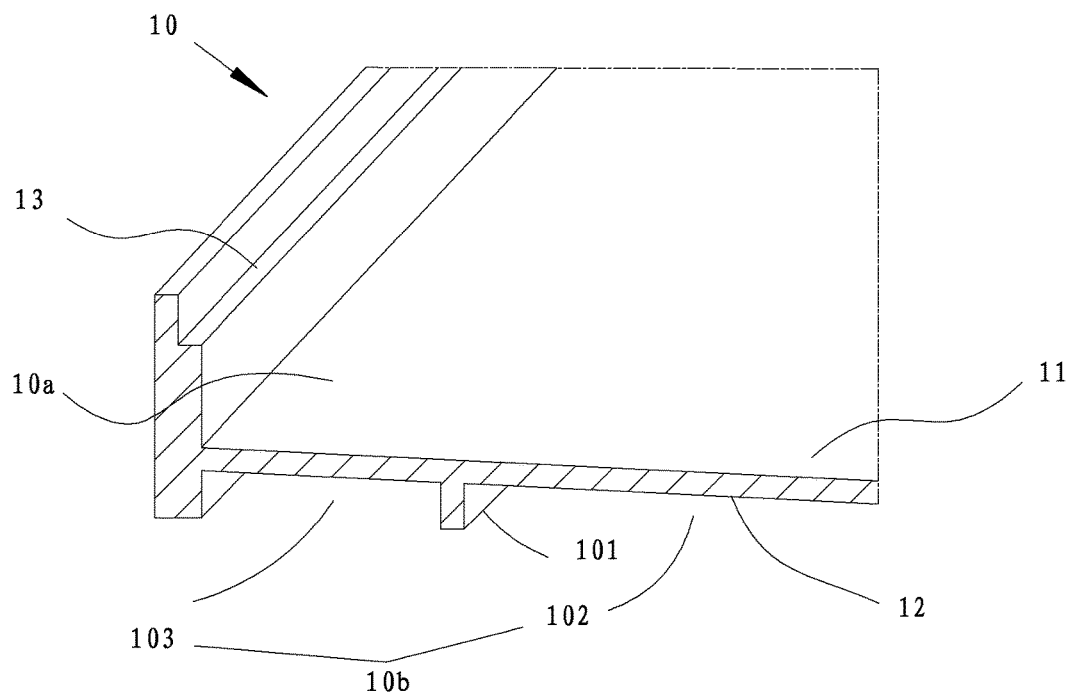
FIG. 1 is a partial sectional structural schematic diagram of an iron frame of a display to present an embodiment in the present invention.
Figure 2:
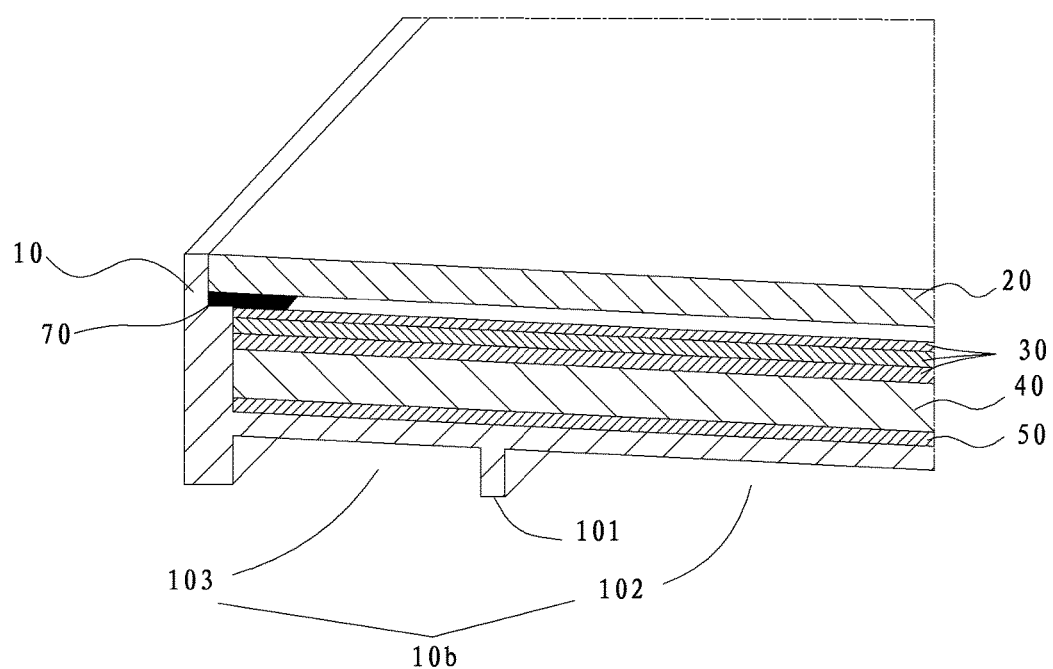
FIG. 2 is a partial sectional structural schematic diagram of a display module to present the embodiment of the present invention.

As shown in FIG. 1 and FIG. 2, an iron frame of a display 10 in the present invention comprises an upper surface 11 and a lower surface 12, the upper surface 11 comprises a first container 10a to dispose a display panel 20, an optical film 30 and a light guide plate 40, and the lower surface 12 comprises at least one second container 10b to dispose an electronic component. Particularly, a plurality of respective second containers 10b are constituted by disposing spacing plates 101 at the lower surface 12 of the iron frame of a display 10.

Wherein, step portions 13 are disposed at two opposite end face s at least of the first container 10a to fix the display panel 20, and the second containers 10b comprise at least a battery container 102 and a processor container 103.

As shown in FIG. 2, the present invention further provides a display module, comprising an iron frame of display 10, a display panel 20, and an optical film 30 and a light guide plate 40, wherein, the iron frame of a display 10 comprises an upper surface 11 and a lower surface 12, the upper surface 11 comprises a first container 10a to dispose a display panel 20, an optical film 30 and a light guide plate 40, and the lower surface 12 comprises a second container 10b to dispose an electronic component. The display panel 20, the optical film 30 and the light guide plate 40 are sequentially stacked from top to bottom within the first container 10a.

Further, the display panel 20 is disposed within the first container 10a, at least two opposite end faces at a lower surface of the display panel 20 are fixed on an upper surface of step portions 13, and a battery, a processor and other electronic components are disposed within the second containers 10b.

In order to increase light guide efficiency of the light guide plate 40, a lower surface of the light guide plate 40 of the display module further comprises a reflective film 50 disposed on an upper surface 11 of the iron frame of a display 10.

Particularly, the display panel 20 is adhesive to upper surfaces of the step portions 13 by shading tape 70, and part of the shading tape 70 is adhesive to an upper surface of the optical film 30 edges.

Containers are disposed at both sides the iron frame of a display provided in the present invention to be used in holding a display panel, an optical film, a light guide plate and electronic components and saving structures of glue frames, backplane and etc. The iron frame is used in the display module of the invention, a display panel, an optical film, a light guide plate and various electronic components are getting together with tight structure by utilizing the iron frame of a display to avoid overlapping functions in structure and facilitate thinning products, designing narrow frames and reducing cost.

The above contents are only specific implementation modes of the present application, and it should be noted that those skilled in the art can also make some improvements and decorations as long as they are not breaking away from the principle of the present application, and these improvements and decorations should be deemed to be within the scope of protection of the present application.

What is claimed is:

1. An iron frame of a display comprises an upper surface and a lower surface, wherein, the upper surface comprises a first container to dispose a display panel, an optical film and a light guide plate, and the lower surface comprises a second container separated from the first container to dispose an electronic component; wherein the first container has a first sidewall extending upwardly from a bottom surface of the first container, the first sidewall is disposed with a step portion at an inner surface of the first sidewall to fix the display panel; wherein the second container has a second sidewall extending downwardly from a bottom surface of the second container, a spacing plate is disposed extending downwardly from the bottom surface of the second container and spaced from the second sidewall to divide the second container into multiple containers.

2. The iron frame of a display according to claim 1, wherein, the multiple containers comprise a battery container and a processor container.

3. A display module, wherein, comprises an iron frame of a display, a display panel, and an optical film and a light guide plate, the iron frame of a display comprises an upper surface and a lower surface, the upper surface comprises a first container to dispose the display panel, the optical film and the light guide plate therein in that order, and the lower surface comprises a second container separated from the first container to dispose an electronic component; wherein the first container has a first sidewall extending upwardly from a bottom surface of the first container, the first sidewall is disposed with a step portion at an inner surface of the first sidewall, the display panel is supported on an upper surface of the step portion, the optical film and the light guide plate are located between the display panel and the bottom surface of the first container; wherein the second container has a second sidewall extending downwardly from a bottom surface of the second container, a spacing plate is disposed extending downwardly from the bottom surface of the second container and spaced from the second sidewall to divide the second container into multiple containers.

4. The display module according to claim 3, wherein, the multiple containers comprises a battery container and a processor container.

5. The display module according to claim 4, wherein, further comprises a shading tape, and the display panel is adhesive to the upper surface of the step portion by the shading tape.

6. The display module according to claim 5, wherein, part of the shading tape is adhesive to an upper surface of the optical film.

7. The display module according to claim 3, wherein, further comprises a reflective film disposed between the light guide plate and the bottom surface of the first container.

* * * * *